(12) United States Patent
Hubbard et al.

(10) Patent No.: US 6,991,961 B2
(45) Date of Patent: Jan. 31, 2006

(54) METHOD OF FORMING A HIGH-VOLTAGE/HIGH-POWER DIE PACKAGE

(75) Inventors: Robert L. Hubbard, Mesa, AZ (US); Juan G. Milla, Mesa, AZ (US)

(73) Assignee: Medtronic, Inc., Minneapolis, MN (US)

( * ) Notice: Subject to any disclaimer, the term of this patent is extended or adjusted under 35 U.S.C. 154(b) by 165 days.

(21) Appl. No.: 10/464,151

(22) Filed: Jun. 18, 2003

(65) Prior Publication Data

US 2004/0259289 A1   Dec. 23, 2004

(51) Int. Cl.
  *H01L 21/00* (2006.01)

(52) U.S. Cl. .................................... 438/106; 257/786
(58) Field of Classification Search ................ 438/106, 438/107; 257/686, 734, 786
See application file for complete search history.

(56) References Cited

U.S. PATENT DOCUMENTS

| | | |
|---|---|---|
| 5,012,323 A | 4/1991 | Farnworth |
| 5,117,282 A | 5/1992 | Salatino |
| 5,186,632 A | 2/1993 | Horton et al. |
| 5,241,454 A | 8/1993 | Ameen et al. |
| 5,281,852 A | 1/1994 | Normington |
| 5,394,608 A | 3/1995 | Tottori et al. |
| 5,428,190 A | 6/1995 | Stopperan |
| 5,463,253 A | 10/1995 | Waki et al. |
| 5,479,051 A | 12/1995 | Waki et al. |
| 5,497,027 A | 3/1996 | Crafts |
| 5,635,427 A | 6/1997 | Takahashi |
| 5,767,576 A | 6/1998 | Kobayashi et al. |
| 5,804,874 A | 9/1998 | An et al. |
| 5,904,499 A | 5/1999 | Pace |
| 5,953,588 A | 9/1999 | Camien et al. |
| 6,022,757 A | 2/2000 | Andoh |
| RE36,613 E | 3/2000 | Ball |
| 6,057,175 A | 5/2000 | Milla et al. |
| 6,121,676 A * | 9/2000 | Solberg ..................... 257/686 |
| 6,245,092 B1 * | 6/2001 | Schaldach, Jr. ............... 607/1 |
| 6,300,679 B1 | 10/2001 | Mukerji et al. ............ 257/738 |
| 6,670,217 B2 * | 12/2003 | Milla et al. ................. 438/107 |
| 2001/0006252 A1 | 7/2001 | Kim et al. ................... 257/688 |
| 2002/0121693 A1 | 9/2002 | Milla et al. |
| 2002/0123172 A1 | 9/2002 | Milla et al. |
| 2002/0127837 A1 | 9/2002 | Milla |
| 2002/0151111 A1 * | 10/2002 | DiStefano et al. ........... 438/123 |

FOREIGN PATENT DOCUMENTS

| | | |
|---|---|---|
| EP | 1 041 633 A1 | 4/2000 |
| WO | WO 99/41786 | 8/1999 |
| WO | WO 02/49109 | 6/2002 |
| WO | WO 02/060527 | 8/2002 |
| WO | WO 03/019654 A1 | 6/2003 |

* cited by examiner

*Primary Examiner*—W. David Coleman
(74) *Attorney, Agent, or Firm*—Girma Wolde-Michael; Carol F. Barry

(57) ABSTRACT

A method for forming a high voltage component package, which includes providing a flexible non-conductive substrate, forming a conductive layer on the substrate, and forming a circuit trace from the conductive layer, the circuit trace having frangible leads. A first side of a component overlies at least a portion of the circuit trace, and the component is coupled to the circuit trace by breaking a frangible lead on the trace and bonding the lead to the component. The flexible substrate is then bent or folded such that another portion of the circuit trace is in proximity to a second side of the component. The trace is coupled to the second side of the component either with a conductive adhesive or by bonding with another frangible trace.

24 Claims, 3 Drawing Sheets

METHOD OF FORMING A HIGH-VOLTAGE/ HIGH-POWER DIE PACKAGE

FIELD OF THE INVENTION

The present invention generally relates to die packaging, and more particularly to a method for forming a high voltage/high-power die package usable for implantable medical devices.

BACKGROUND OF THE INVENTION

Die packaging has continued to receive a significant amount of attention from designers and manufacturers of electronic products. This attention is based upon the market demand for products with greater efficiency, higher performance, and smaller dimensions. The market demand for smaller dimensions is driven, to at least some extent, by portable electronic product applications, such as Implantable Medical Devices (IMDs).

As the dimensions of an IMD package becomes smaller and smaller, and as more and more components are added to such a device, the area within the IMD package that is available for the additional components is substantially reduced. Furthermore, as the dimensions of the components are also shrinking, it is desirable to improve the use of all three dimensions within the IMD package. While die packages that improve the utilization of all three dimensions within electronic packages have been designed and manufactured, including portable electronic packages such as IMD packages, further improvements are sought to the die package and the methods of forming the die package. For example, designers and manufactures seek improvements in the efficiency and cost effectiveness of flip chip die packages and the methods of forming these flip chip die packages.

High voltage and high power die present additional challenges in packaging since such die frequently have an electrical contact on both sides of the die. High power/voltage die refers to an electronic component or device that is operable with a potential greater than about fifty (50) volts across any two electrical terminals or contacts of the component. Such high power/voltage components may be further operable at DC voltages greater than about one hundred (100) volts, and even further may be operable at DC voltages greater than about three hundred (300) volts, five hundred (500) volts, one thousand (1,000) volts and even greater, perhaps as great as 1600 volts or more.

Such high power/voltage components include, but are not limited to, high voltage die and high voltage surface mount components. Such components have two or more electrical contact regions associated therewith. Such contact regions may be located anywhere on the component, (e.g., top, bottom, edge, etc.). High power/voltage die refers generally to a solid state switching device, capacitor, resistor, rectifier, or any other solid-state electronic device formed using semiconductor processing techniques. For example, high power/voltage die may include devices such as field effect transistors (FETs), metal oxide semiconductor FETs (MOSFETs), insulated gate FETs (IGFETs), thyristors, bipolar transistors, diodes, MOS-controlled thyristors, resistors, etc. Further characteristics of high power/voltage dice may include the ability to switch or conduct large currents, vertical current flow from the bottom or backside of the die to the top or the front side of the die, and/or active pads or contacts on both the top and bottom surfaces of the dice, for example.

Therefore a preferred solution to chip scale packaging of high power/voltage die has been to wire bond the die to a substrate and have a dielectric insulator applied around and above the die. U.S. Pat. No. 6,057,175, which is assigned to the assignee of the instant invention, shows such an arrangement, but this packaging technique increases the size of the die area on the substrate as well as the height of the overall package. Thus there exists the need for a flip-chip approach including a dielectric coating for high power/voltage devices.

In view of the foregoing, it should be appreciated that it would be desirable to provide a method for forming a die package, including a flip chip package. In addition, it would be desirable to improve the method for forming a die package, such as improving the efficiency and cost effectiveness of such method. Furthermore, additional desirable features will become apparent to one of ordinary skill in the art from the foregoing background of the invention and following summary, brief description of the drawings, detailed description of the drawings, and appended claims.

SUMMARY OF THE INVENTION

A method for forming a high voltage/power die package is provided in accordance with the teachings of the present invention. The method comprises attaching a first side of a die to a flexible substrate, the substrate having circuit traces thereon, bonding the first side of the die to the substrate and the terminals of the die to the traces, folding the flexible substrate such that the traces overlay a second side of the die, and bonding the traces to terminals on the second side of the die.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

In the following detailed description of the embodiments, reference is made to the accompanying drawings, which form a part hereof, and in which is shown by way of illustration specific embodiments in which the present invention may be practiced in accordance with the present invention. However, it is to be understood that other embodiments may be utilized and structural or logical changes may be made without departing from the scope of the present invention.

Figure 1:
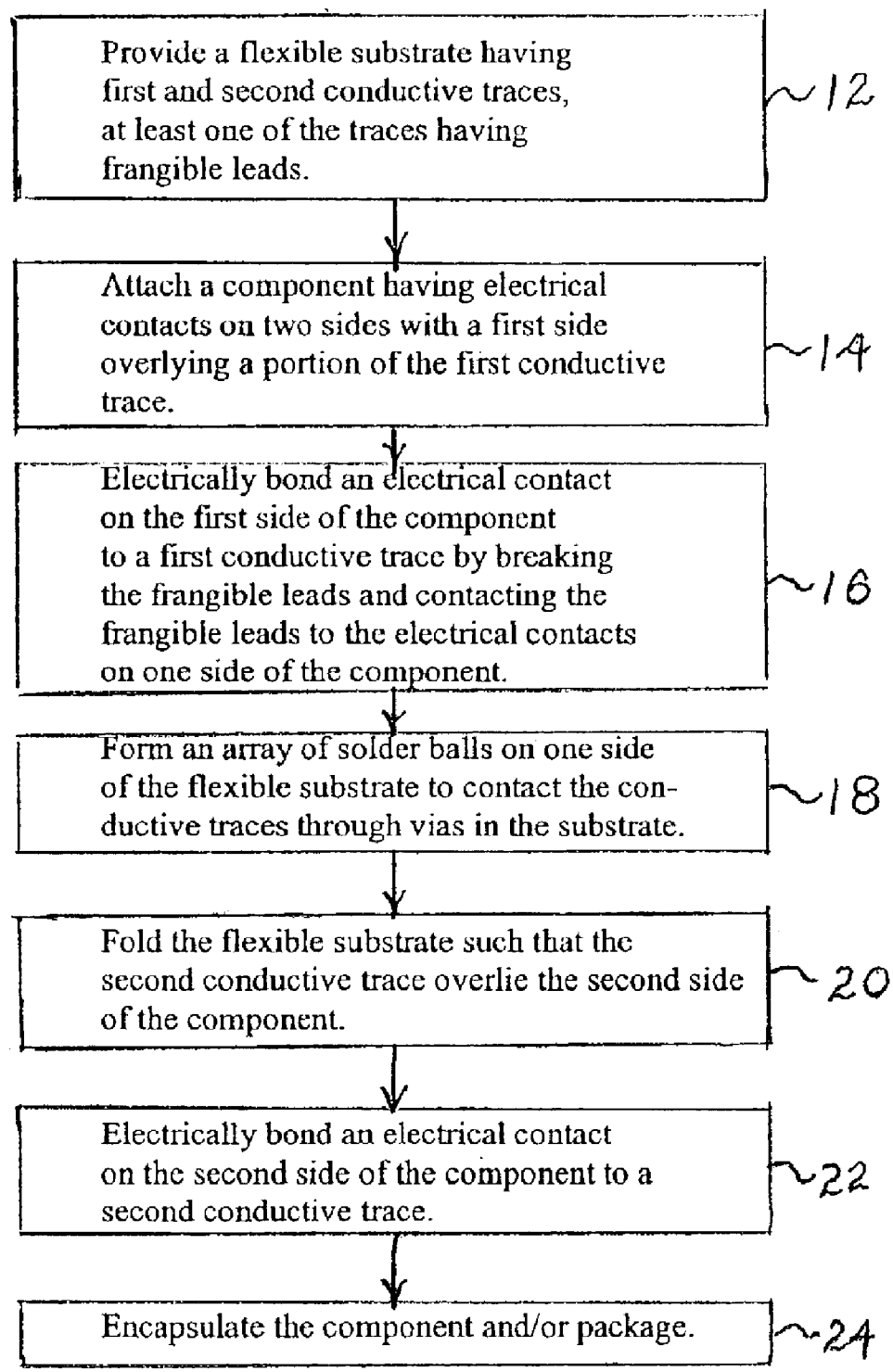
FIG. 1 is a flow chart of an exemplary embodiment of the invention.

An exemplary embodiment of the invention is set forth in the flow chart of FIG. 1, which is particularly beneficial in packaging high voltage discrete die and other high voltage components with low pin counts into a chip scale surface-mountable package, where "high voltage component" or "high voltage discrete die" is defined herein as a device that is operable with a potential greater than fifty (50) volts, preferably greater than one hundred (100) volts, more preferably greater than five hundred (500) volts, and even more preferably greater than one thousand (1000) or sixteen hundred (1600) volts. However, one of ordinary skill in the art will recognize that other die and components can be packaged in like manners, and the die package formed in accordance with the method of FIG. 1 can be used in a wide variety of applications. The die package or high voltage die package formed in accordance with the method can include any number of devices such as Field Effect Transistors (FETs), Metal Oxide Semiconductor (MOS) FETs (MOSFETs), Insulated Gate FETs (IGFETs), thyristors, bipolar transistors, diodes, MOS-controlled thryristors, resistors or equivalent, and particularly devices with electrical contacts on both sides of the component.

Referring to FIG. 1, a substrate is provided at 12. The substrate is preferably formed of a material which is flexible, such as a polyimide, plastic, polyester, fluoropolymer, epoxy film, polyethylene film or fluoropolymer film, or a combination of these materials. A conductive layer is formed on top of the substrate, which conductive layer may be etched to form conductive paths or traces.

A die or component having electrical contacts or bonding pads on both sides thereof is mounted 14 on the flexible substrate with a first side at least partially overlaying a portion of the conductive traces. The first side of the die may have several bonding pads. The die is mounted such that each of the contacts or pads on the first side overlies one or more frangible leads, the function of which will be explained later. The die may be mounted with a non-conductive adhesive to hold the die in position for further processing. The adhesive may be in the form of adhesive dots or posts to tack the die temporarily.

The electrical contacts or bonding pads on the first side of the die or component are bonded 16 to the first trace by breaking the frangible leads overlying the electrical contacts and using conventional bonding techniques, such as thermosonic or thermocompression bonding.

An array of solder balls is applied to one side of the substrate 18, vias provided through the substrate to allow the solder balls to contact the circuit traces. The solder balls are preferably formed on one side of the package to allow for flip-chip mounting of the packaged component. As will be discussed later, in conjunction with the descriptions of FIG. 2 and FIG. 3, the circuit traces designed to contact the second side of the component are etched such that they extend from the second side of the package to the first side to facilitate flip-chip mounting.

The flexible substrate is then folded 20 such that the conductive traces on a portion of the substrate overlie the second side of the die or component. The conductive traces are then bonded to the electrical terminals on the second side of the die at 22. The bonding of the traces to the second side of the die or component may be provided with any number of techniques, such as application of a means of a conductive adhesive. Preferably the electrical contact on the second side of the die is a single electrical contact. If the second side of the die contains more than one electrical contact, the bonding method takes this into account.

The packaged component may then (optionally) be encapsulated 24 to complete the package in preparation for mounting in another circuit for use in, for example, an implantable medical device, and, if the process has been performed with a plurality of die, a singulation may take place at this point or prior to encapsulation to form individual packages.

The steps or sub-steps of the invention are presented in this detailed description of the FIG. 1 in a preferred sequential order. However, several of the steps of this process can be performed in a different sequential order without departing from the scope of the invention. For example, the steps of contacting one side or the other of the component may be taken in another order in order to accommodate components with different numbers of electrical contacts on one side or the other of the component. Other variations in the process sequence will become apparent to those skilled in the art, and the order of the steps of the process is not to be considered limiting in any fashion.

Figure 2:
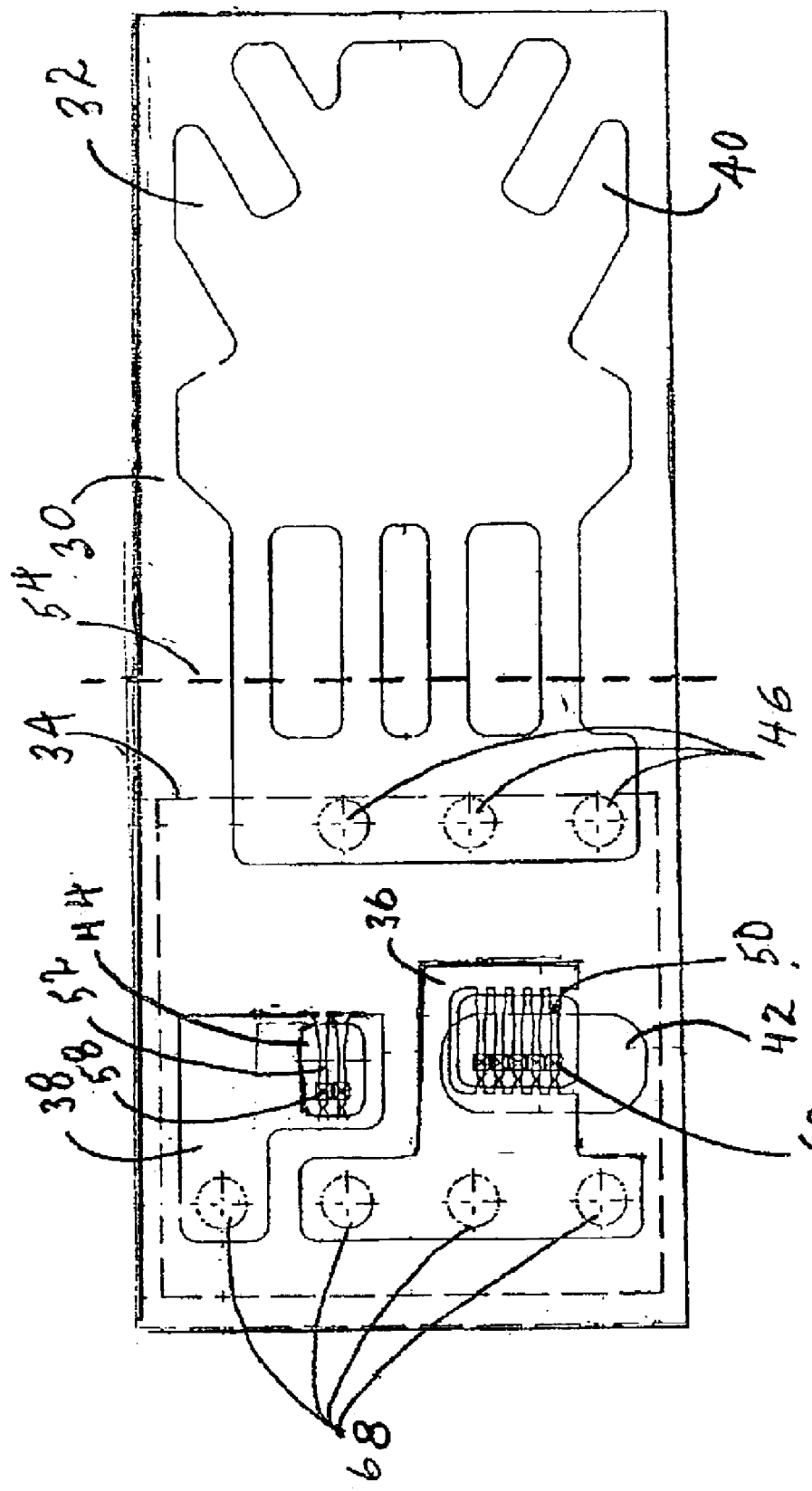
FIG. 2 is a plan view of a flexible substrate upon which a die is to be mounted, the first side of the die lying above conductive traces formed on the substrate.
Figure 3:
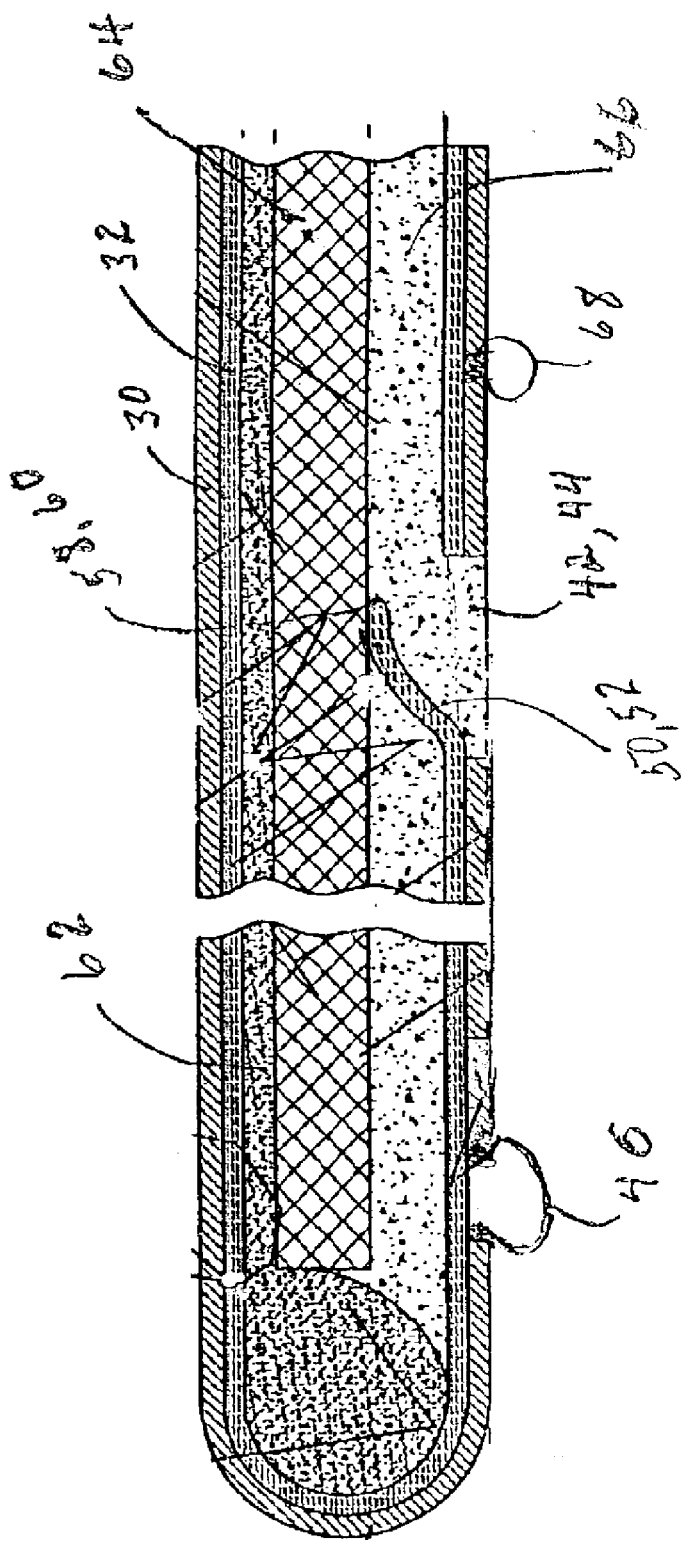
FIG. 3 is a side view of a die mounted on a flexible substrate, where the substrate is folded over to allow contact between a conductive trace on the substrate and a second side of the die.

FIG. 2 and FIG. 3 show a top view and a side view, respectively, of the package and the associated component, and the following description will refer to both FIG. 2 and FIG. 3. More specifically, FIG. 2 shows a flexible substrate 30 on which is to be mounted one or more semiconductor die or other electronic components. The substrate is preferably formed of a material which is flexible, such as a polyimide, plastic, polyester, fluoropolymer, epoxy film, polyethylene film or fluoropolymer film, or a combination of these materials. A conductive layer 32 is formed on top of the substrate 30, which conductive layer may be etched to form conductive paths or traces. FIG. 3 shows a side view of the substrate 30 and the conductive layer 32.

Referring again to FIG. 2, a die mount area is generally shown in dashed lines at 34. Circuit traces 36, 38, and 40 are shown, which are formed by etching away the conductive layer 32 in those areas where traces are not desired. Generally there may be as many traces as there are electrical contacts on the die, in this case two traces 36 and 38 corresponding to two electrical contacts on a first side of the die and one trace, 40, for contact to the second side of the die. Portions 42 and 44 of the substrate 30 may be removed to allow contact between the traces and the die as will be explained in more detail later.

As previously noted, high power/voltage die usually have few electrical contacts, and typically a field effect transistor die will have only three: one on one side of the die and two on the other side as shown in FIG. 2. A die (not shown for clarity of representing the underlying circuit traces) may be mounted on the die mount area 34 with a first side of the die having two terminals, one overlying each of the voids 42 and 44 in circuit traces 36 and 38, respectively. The circuit trace 40, which will subsequently be folded over the second side (the top in FIG. 2), has a plurality of vias 46 through the substrate by which solder ball connections may be made through the substrate to the side of the die adjacent trace 40 to allow subsequent surface mounting of the completed package. Circuit traces 36 and 38 likewise have vias 68 through the substrate to allow electrical contact through the substrate by solder balls.

After placing the die (64 in FIG. 3, but not shown in FIG. 2) on the die mount area 34 and tacking or adhering it in place, rows of solder balls 46 and 68 are applied at the vias to provide electrical contact between the circuit traces and both sides of the die. The die 64 may be tacked in place for further processing by using non-conductive adhesive dots or posts to elevate the die 64 slightly above the circuit traces as can be seen more clearly in FIG. 3.

Subsequently the portion of the substrate containing circuit trace 40 is folded over the die approximately along the line 54. The second side of the die, i.e., the back side is physically and electrically coupled to the trace 40 with a conductive adhesive 62 or by another convenient means.

As can be seen, circuit trace 40 extends from the die contact area, past fold-line 54 and around the side of the package such that the solder ball vias 46 are on the same side of completed package as the solder ball vias 68 to allow for surface mounting of the packaged die.

As can be seen in FIG. 2, circuit traces 36 and 38 have associated therewith frangible contact elements 50 and 52, respectively, for contact with two electrical terminals on the first side of the component or die. The flexible substrate 30 beneath these contact elements 50 and 52 has been removed at 42 and 44 as previously described. As shown in FIG. 3, the openings 42 and 44 in the substrate 30 allow access to the frangible leads 50 and 52 positioned adjacent to electrical contacts on the die.

The frangible contact elements 50 and 52 are pushed toward the die thus breaking the contact elements at points 58 and 60 whereby the contact elements may be used as lead bonds in place of conventional wire bonds to the electrical terminals or bonding pads of the die. The contact elements 50 and 52 are bonded to the die using any conventional technique but preferably such as thermosonic or thermocompression lead bonding. The number of frangible leads provided for each of the electrical terminals on the die is determined by the amount of current that is expected to be carried at that terminal. A higher current would require more leads to be broken and bonded to the die.

FIG. 3 shows a side view of the package, the substrate being indicated at 30 and the conductive circuit trace layer at 32. Representative frangible contact elements 50 and 52 are shown bent upward to contact a die 64, the contact elements 50 having been broken away from the circuit trace 36 or 38 at point 60. The die 64 is attached to trace 32 by a conductive adhesive 62.

Traces 36 and 38 carry the electrical contacts of the first side of the die or component to an array of solder balls 68 on one surface of the package. The package containing the high power/voltage component or die then has all electrical contacts from both sides of the component or die carried to the same surface of the package, thus making the package suitable for surface mounting.

Finally, the component may be encapsulated inside the package by injecting a suitable non-conductive potting compound 66 around the die 64 to fill in any gaps remaining from the non-conductive adhesive posts or dots that originally held the die in place in preparation for folding of the substrate and electrical bonding of the die. Alternatively the entire package (except, of course, for the solder balls 46 and 68) may be encapsulated by a suitable compound.

As can be seen in both FIG. 2 and FIG. 3, the entire package has a footprint only slightly larger than that of the component or die, thus providing a small package suitable for use in an Implantable Medical Device (IMD).

From the foregoing description, it should be appreciated that methods are provided for forming a die package that present significant benefits, which have been presented in the background of the invention, summary, brief description of the drawings, and detailed description of the drawings and also present significant benefits that would be apparent to one or ordinary skill in the art. Furthermore, while an embodiment has been presented in the foregoing detailed description of the drawings, it should be appreciated that a vast number of variations in the embodiment exist. It should also be appreciated that the shown embodiment is a preferred exemplary embodiment only, and is not intended to limit the scope, applicability, or configuration of the invention in any way. Rather, the foregoing detailed description provides those skilled in the art with a convenient road map for implementing a preferred exemplary embodiment of the invention, it being understood that various changes may be made in the function and arrangement of elements described in this detailed description of the drawings without departing from the spirit and scope of the invention as set forth in the appended claims.

What is claimed is:

1. A method for forming a flip chip component package for a component having electrical contacts on more than one side of the component, comprising:

providing a flexible substrate substantially twice the width of the component, forming a conductive layer on the substrate, forming electrically separate circuit traces from the conductive layer, at least one of the circuit traces having frangible leads, attaching a first side of the component to a first circuit trace, folding the substrate such that a second circuit trace overlies the second side of the component, electrically bonding the first side of the component to the first circuit trace, electrically bonding the second side of the component to the second circuit trace, one of the bonds being made by breaking the frangible leads and contacting the frangible leads to the component.

2. A method as set forth in claim 1 in which both the first circuit trace and the second circuit trace have vias positioned such that when the substrate is folded all the vias are on the same side of the component.

3. A method as set forth in claim 2 further comprising applying solder balls to the vias such that the component can be mounted on a circuit board.

4. The method for forming the component package as set forth in claim 1, wherein said component is a device selected from the group comprising a Field Effect Transistor (FET), Metal Oxide Semiconductor (MOS) FET (MOSFET), Insulated Gate FET (IGFET), thyristors, bipolar transistors, diodes, MOS-controlled thyristors, and resistors.

5. A method as set forth in claim 1 wherein the flexible substrate is a material selected from the group comprising a polyimide, a polyester, a fluoropolymer epoxy, a polyethylene, and a fluorocarbon.

6. A method as set forth in claim 4 wherein the component is operable with a potential greater than fifty (50) volts.

7. A method as set forth in claim 4 wherein the component is operable with a potential greater than five hundred (500) volts.

8. A method as set forth in claim 4 wherein the component is operable with a potential greater than one thousand (1000) volts.

9. The method for forming the component package of claim 1, wherein the circuit trace is coupled to the first side of the component by bonding with a frangible lead of the circuit trace.

10. A method of forming a portable electronic product application, comprising:

forming a component package, comprising:

providing a flexible substrate substantially twice the width of the component, forming a conductive layer on the substrate, forming electrically separate circuit traces from the conductive layer, at least one of the circuit traces having frangible leads, attaching a first side of the component to a first circuit trace, folding the substrate such that a second circuit trace overlies the second side of the component, electrically bonding the first side of the component to the first circuit trace, electrically bonding the second side of the component to the second circuit trace, one of the bonds being made by breaking the frangible leads and contacting the frangible leads to the component.

11. The method of forming the portable electronic product application of claim 10, wherein said coupling said component package to the portable electronic product application comprises mounting said component package to the portable electronic product application.

12. The method of forming the portable electronic product application of claim 10, wherein said coupling said component package to the portable electronic product application comprises surface mounting said component package to the portable electronic product application.

13. The method of forming the portable electronic product application of claim 10, wherein said portable electronic product application is an Implantable Medical Device (IMD).

14. The method of forming the portable electronic product application of claim 10, wherein said component is operable with a potential greater than fifty (50) volts.

15. The method of forming the portable electronic product application of claim 10, wherein said component is operable with a potential greater than five hundred (500) volts.

16. The method of forming the portable electronic product application of claim 10, wherein said component is operable with a potential greater than one thousand (1000) volts.

17. The method of forming the portable electronic product application of claim 10, wherein said component package comprises a device selected from the group comprising a Field Effect Transistor (FET), Metal Oxide Semiconductor (MOS) FET (MOSFET), Insulated Gate FET (IGFET), thyristors, bipolar translators, diodes, MOS-controlled thryristors, and resistors.

18. The method of forming the portable electronic product application of claim 10, wherein said flexible substrate is a material selected from the group comprising a polylmide, polyester, fluoropolymer epoxy, polyethylene, and a fluorocarbon.

19. The method for forming the portable electronic product application of claim 10, wherein the circuit trace is coupled to the second side of the component with a conducting interface.

20. The method for forming the portable electronic product of claim 19, wherein said conducting interface is a conductive adhesive.

21. The method for forming the component package of claim 10, wherein the circuit trace is coupled to the first side of the component by bonding with a frangible lead of the circuit trace.

22. A method for forming a surface mount component package for a component having electrical contacts on more than one side of the component, comprising:

providing a flexible substrate having a conductive layer thereon, forming electrically separate circuit traces in the conductive layer, at least one of the circuit traces having frangible leads, attaching a first side of the component to a first circuit trace such that the circuit trace makes electrical contact with the electrical contact on the first side of the component, folding the substrate such that a second circuit trace overlies the second side of the component such that the second circuit trace makes electrical contact with the electrical contact on the second side of the component one of the electrical contacts being made by breaking the frangible leads and contacting the frangible leads to an electrical contact of the component.

23. A method as set forth in claim 22 wherein each of the circuit traces is contacted by solder balls extending through vias in the substrate.

24. A method as set forth in claim 23 wherein all of the solder balls are on the same side of the package to allow flip-chip like mounting of the package.

* * * * *

UNITED STATES PATENT AND TRADEMARK OFFICE
CERTIFICATE OF CORRECTION

PATENT NO. : 6,991,961 B2  Page 1 of 1
APPLICATION NO. : 10/464151
DATED : January 31, 2006
INVENTOR(S) : Hubbard et al.

It is certified that error appears in the above-identified patent and that said Letters Patent is hereby corrected as shown below:

On The Title Page (54) and column 1 line 1 please change "Method of" to --Method for--.

In column 7, line 34 please change "bipolar translators" to --bipolar transistors--.

In column 7, line 38 please change "a polylmide" to --a polyimide--.

Signed and Sealed this

Ninth Day of October, 2007

JON W. DUDAS
*Director of the United States Patent and Trademark Office*